(12) United States Patent
Puglisi et al.

(10) Patent No.: US 9,024,357 B2
(45) Date of Patent: May 5, 2015

(54) METHOD FOR MANUFACTURING A HEMT TRANSISTOR AND CORRESPONDING HEMT TRANSISTOR

(75) Inventors: Valeria Puglisi, Catania (IT); Corinna Altamore, Siracusa (IT); Giovanni Abagnale, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 285 days.

(21) Appl. No.: 13/441,640

(22) Filed: Apr. 6, 2012

(65) Prior Publication Data

US 2012/0261720 A1  Oct. 18, 2012

(30) Foreign Application Priority Data

Apr. 15, 2011  (IT) .............................. MI2011A0645

(51) Int. Cl.
*H01L 29/778* (2006.01)
*H01L 29/423* (2006.01)
*H01L 29/66* (2006.01)
(Continued)

(52) U.S. Cl.
CPC ...... *H01L 29/7787* (2013.01); *H01L 29/42376* (2013.01); *H01L 29/2003* (2013.01); *H01L 29/66462* (2013.01); *H01L 29/4236* (2013.01)

(58) Field of Classification Search
CPC ........ H01L 29/778–29/7787; H01L 29/66462; H01L 29/66431; H01L 29/42368; H01L 29/42356
USPC .......... 257/183, 194–195, E29.246–E29.252, 257/E21.403–E21.407; 438/167, 172
See application file for complete search history.

(56) References Cited

U.S. PATENT DOCUMENTS

| 6,521,961 B1 * | 2/2003 | Costa et al. ................... 257/402 |
| 7,829,448 B1 * | 11/2010 | Chang et al. .................. 438/576 |
| 7,999,286 B2 * | 8/2011 | Ohta et al. .................... 257/194 |

(Continued)

FOREIGN PATENT DOCUMENTS

| EP | 1 921 669 A1 | 5/2008 |
| EP | 1 965 433 A2 | 9/2008 |

OTHER PUBLICATIONS

Dongfang et al., "Gate Structure Optimization for High Frequency Power AlGaN/GaN HEMTS," Chinese Academy of Science, vol. 31, No. 5, May 2010.*

(Continued)

*Primary Examiner* — Laura Menz
*Assistant Examiner* — Maliheh Malek
(74) *Attorney, Agent, or Firm* — Seed IP Law Group PLLC

(57) ABSTRACT

A method for manufacturing a HEMT transistor includes: realizing an undoped epitaxial layer on a substrate; realizing a barrier epitaxial layer on the undoped epitaxial layer so as to form a heterojunction; realizing source and drain structures, separated from one other, on the barrier epitaxial layer; depositing an insulating layer on the barrier epitaxial layer and on the source and drain structures; and photolithographic defining the insulating layer, defining first and second insulating portions in correspondence of the source and drain structures, respectively, and exposing a portion of the barrier epitaxial layer. The method further comprises: forming first and second spacers lying at the corners of the first and second insulating portions; and depositing a gate metal structure at least partially covering said first and second insulating portions, and said first and second spacers, said gate metal structure being a field plate of the HEMT transistor.

20 Claims, 10 Drawing Sheets

(51) Int. Cl.
*H01L 21/336* (2006.01)
*H01L 29/20* (2006.01)

(56) References Cited

U.S. PATENT DOCUMENTS

| | | | | |
|---|---|---|---|---|
| 8,012,816 | B2* | 9/2011 | Radosavljevic et al. | 438/172 |
| 8,120,066 | B2* | 2/2012 | Lanzieri et al. | 257/194 |
| 8,198,178 | B2* | 6/2012 | Heikman et al. | 438/478 |
| 8,212,290 | B2* | 7/2012 | Heikman et al. | 257/195 |
| 8,237,198 | B2* | 8/2012 | Wu et al. | 257/194 |
| 8,357,571 | B2* | 1/2013 | Radulescu et al. | 438/172 |
| 8,426,260 | B2* | 4/2013 | Miyajima et al. | 438/173 |
| 8,476,125 | B2* | 7/2013 | Khan et al. | 438/172 |
| 8,624,260 | B2* | 1/2014 | Ramdani | 257/76 |
| 2003/0082860 | A1* | 5/2003 | Yoshida et al. | 438/184 |
| 2003/0122152 | A1* | 7/2003 | Kim et al. | 257/194 |
| 2006/0043416 | A1* | 3/2006 | Li et al. | 257/192 |
| 2007/0018199 | A1 | 1/2007 | Sheppard et al. | |
| 2007/0252199 | A1* | 11/2007 | Chung et al. | 257/330 |
| 2008/0017844 | A1* | 1/2008 | Nichols et al. | 257/20 |
| 2010/0025730 | A1* | 2/2010 | Heikman et al. | 257/194 |
| 2010/0102359 | A1* | 4/2010 | Khan et al. | 257/194 |
| 2010/0155720 | A1* | 6/2010 | Kaneko | 257/43 |
| 2010/0314663 | A1 | 12/2010 | Ito et al. | |
| 2011/0057272 | A1 | 3/2011 | Kurahashi et al. | |
| 2011/0089468 | A1* | 4/2011 | Zhang | 257/194 |
| 2011/0133205 | A1* | 6/2011 | Nagahisa et al. | 257/76 |
| 2011/0241020 | A1* | 10/2011 | Saunier | 257/77 |
| 2011/0263102 | A1* | 10/2011 | Heikman et al. | 438/478 |
| 2011/0309372 | A1* | 12/2011 | Xin et al. | 257/76 |
| 2012/0119260 | A1* | 5/2012 | Radulescu et al. | 257/194 |
| 2012/0139038 | A1* | 6/2012 | Imanishi et al. | 257/330 |
| 2012/0153390 | A1* | 6/2012 | Mishra et al. | 257/339 |
| 2012/0217543 | A1* | 8/2012 | Minoura et al. | 257/190 |
| 2012/0223319 | A1* | 9/2012 | Dora | 257/76 |
| 2013/0087804 | A1* | 4/2013 | Yao et al. | 257/76 |
| 2013/0105817 | A1* | 5/2013 | Saunier | 257/77 |
| 2013/0146891 | A1* | 6/2013 | Xin et al. | 257/76 |
| 2013/0161641 | A1* | 6/2013 | Kub et al. | 257/76 |
| 2014/0070278 | A1* | 3/2014 | Briere | 257/194 |
| 2014/0097471 | A1* | 4/2014 | Briere | 257/194 |

OTHER PUBLICATIONS

Ikeda, N. et al., "Normally-off operation power AlGaN/GaN HFET," Proc. of the 2004 Int'l Symp. on Power Semiconductor Devices & ICs, Kitakyushu, Japan, pp. 369-372.

Im, K. et al., "Normally Off GaN MOSFET Based on AlGaN/GaN Heterostructure With Extremely High 2DEG Density Grown on Silicon Substrate," IEEE Electron Device Letters, vol. 31, No. 3, Mar. 2010, pp. 192-194.

Kambayashi, H. et al., "Normally Off n-Channel GaN MOSFETs on Si Substrates Using an SAG Technique and Ion Implantation," IEEE Electron Device Letters, vol. 28, No. 12, Dec. 2007, pp. 1077-1079.

Kim, D. et al., "Normally-off operation of $Al_2O_3$/GaN MOSFET based on AlGaN/GaN heterostructure with p-GaN buffer layer," Proc. of the 22nd Int'l Symp. on Power Semiconductor Devices & IC's, Hiroshima, Japan, pp. 229-231, Jun. 6-10, 2010.

Lanford, W.B. et al., "Recessed-gate enhancement-mode GaN HEMT with high threshold voltage," Electronics Letters 41(7), 2 pgs., Mar. 31, 2005.

Ueda, D. et al., "AlGaN/GaN Devices for Future Power Switching Systems," IEEE International Electron Devices Meeting (IEDM), Washington, DC, pp. 377-380, Dec. 2005.

Wang, W-K. et al., "Performance Enhancement by Using the n+-GaN Cap Layer and Gate Recess Technology on the AlGaN-GaN HEMT Fabrication," IEEE Electron Device Letters 26(1):5-7, Jan. 2005.

Karmalkar, S., "GaN-Based Power High Electron Mobility Transistors," *Wide Energy Bandgap Electronic Devices*, Chapter 3, pp. 173-216, 2003.

* cited by examiner

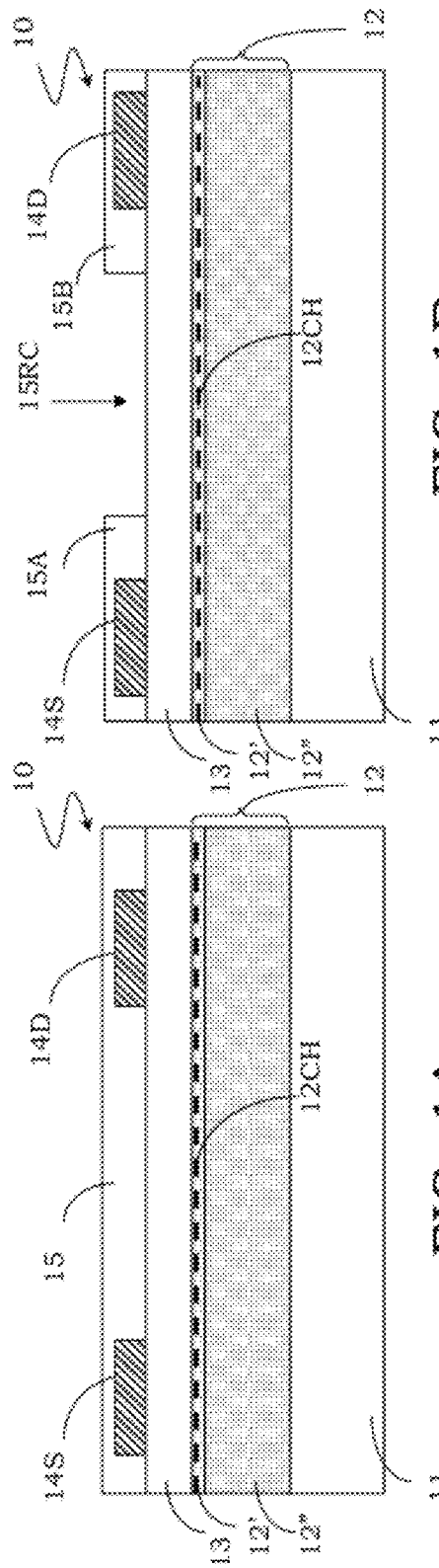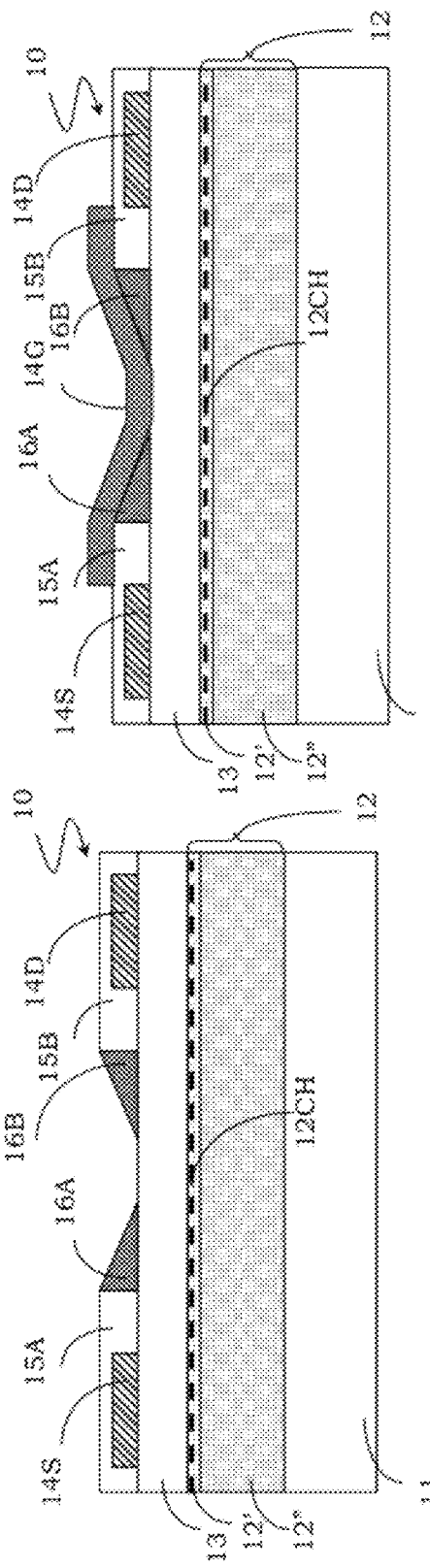

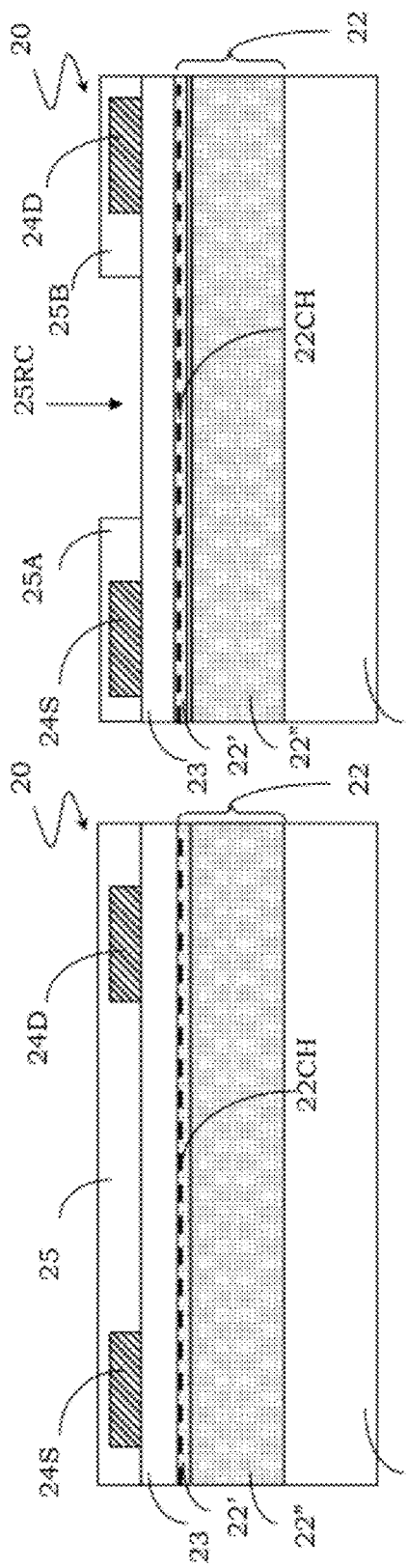
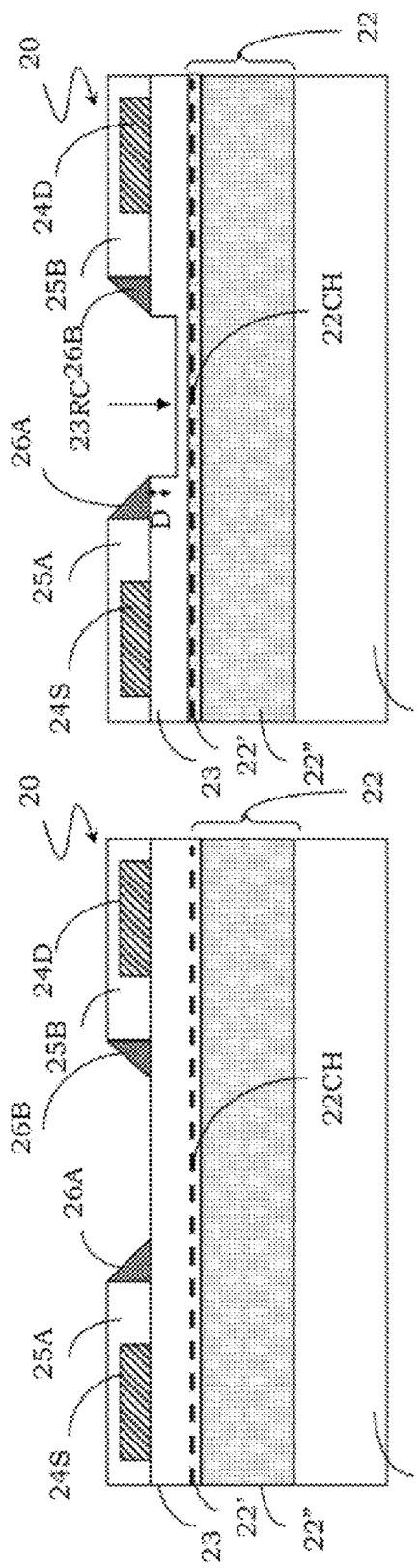
FIG. 2A  FIG. 2B  FIG. 2C  FIG. 2D

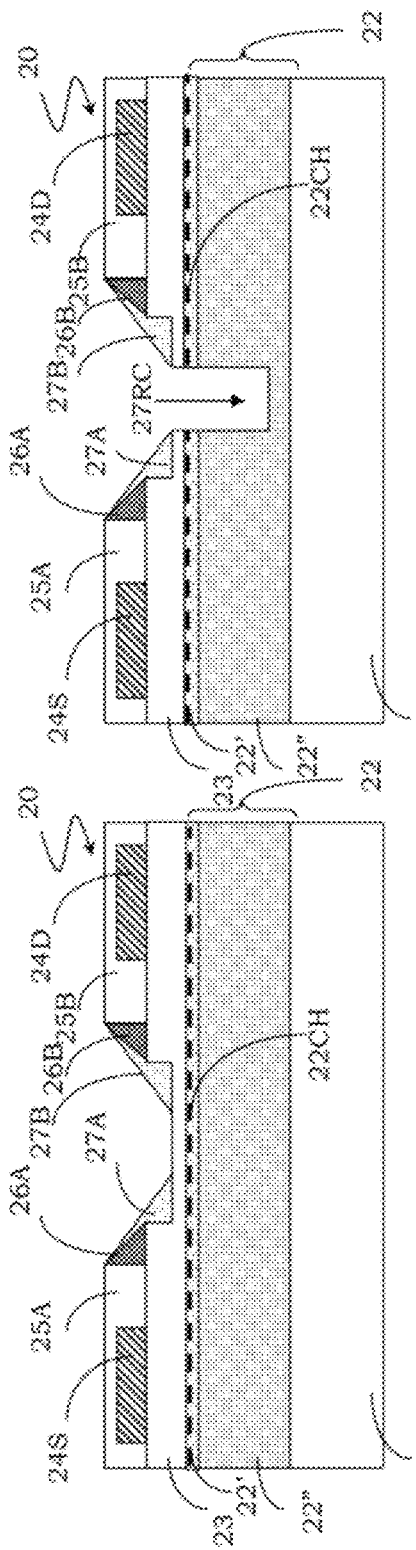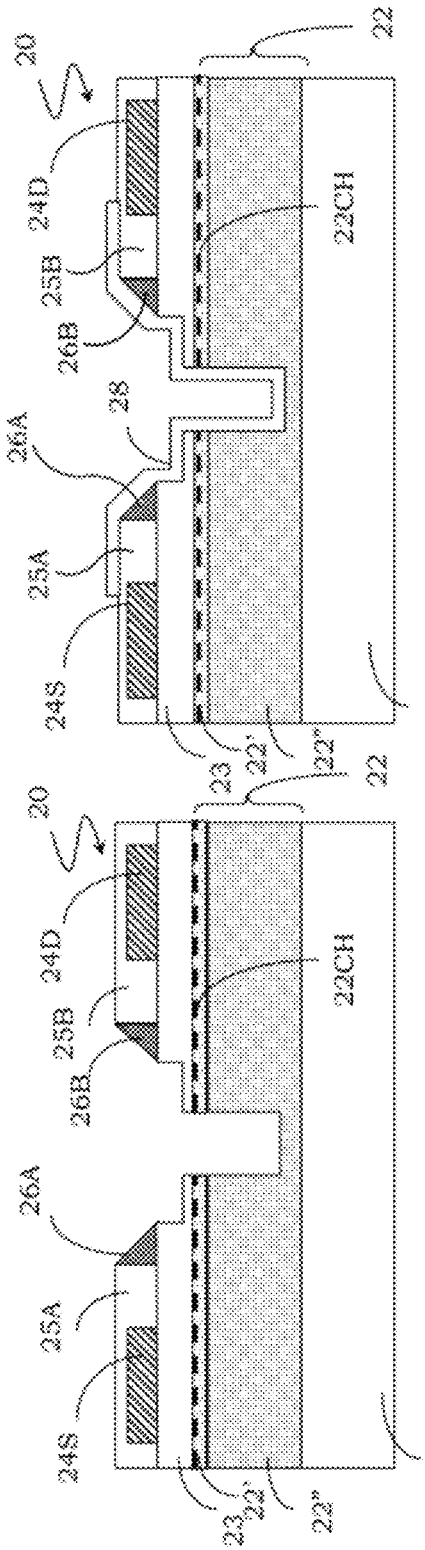

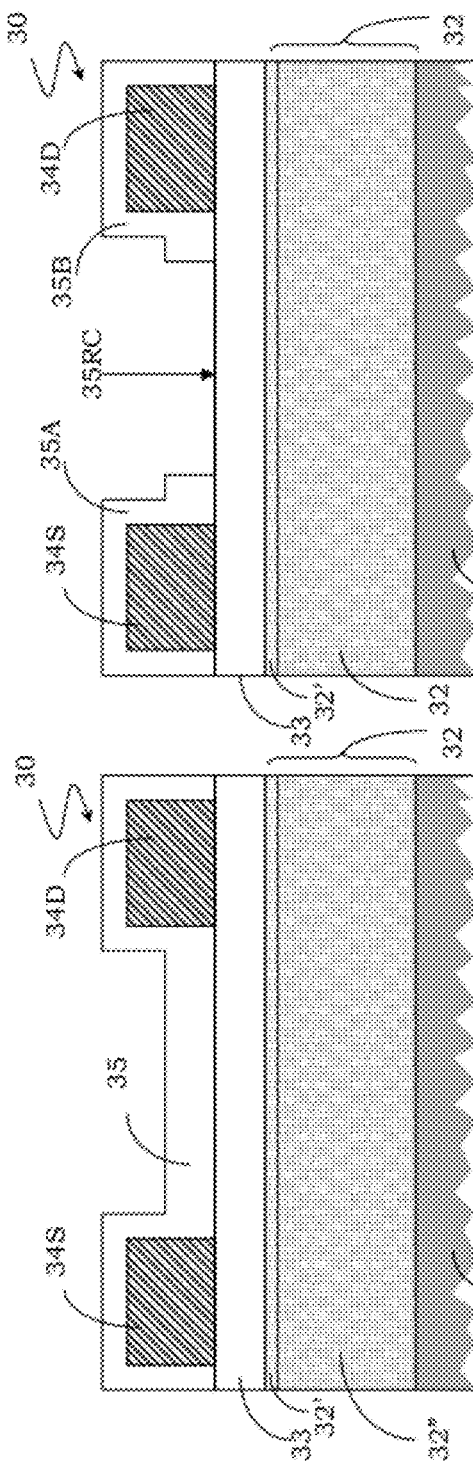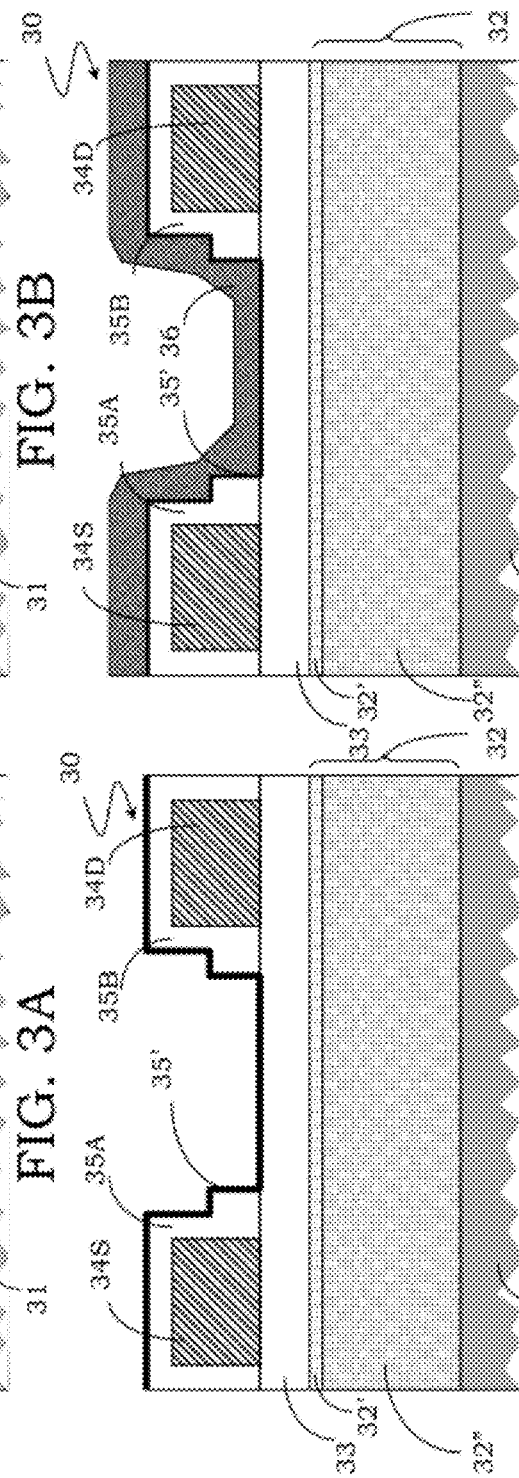
FIG. 3A
FIG. 3B
FIG. 3C
FIG. 3D

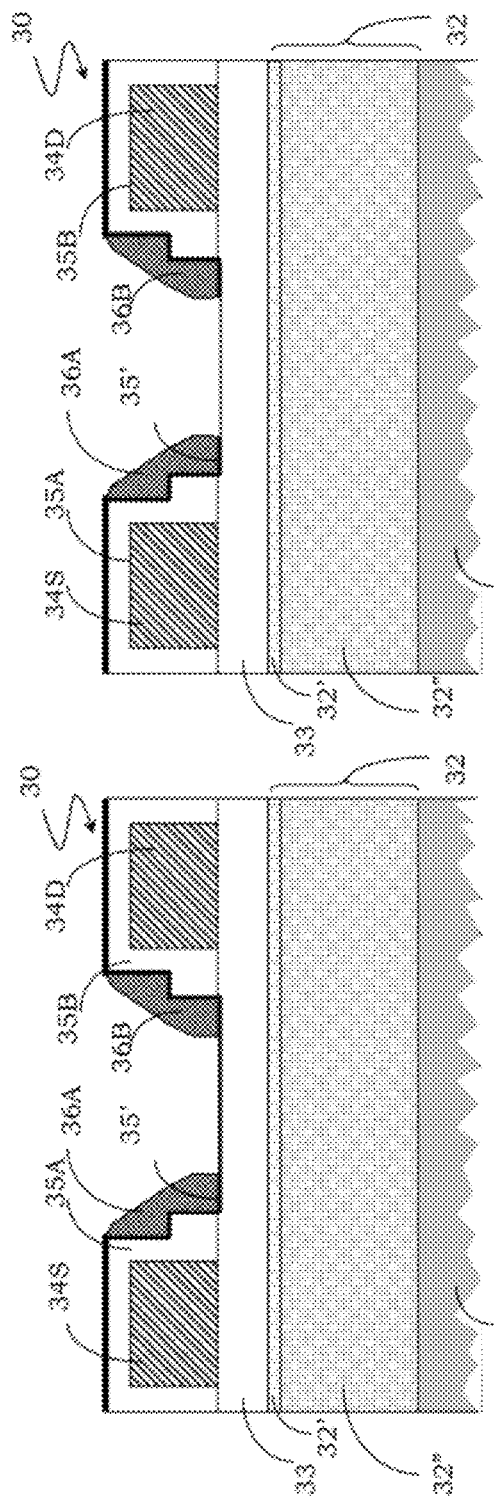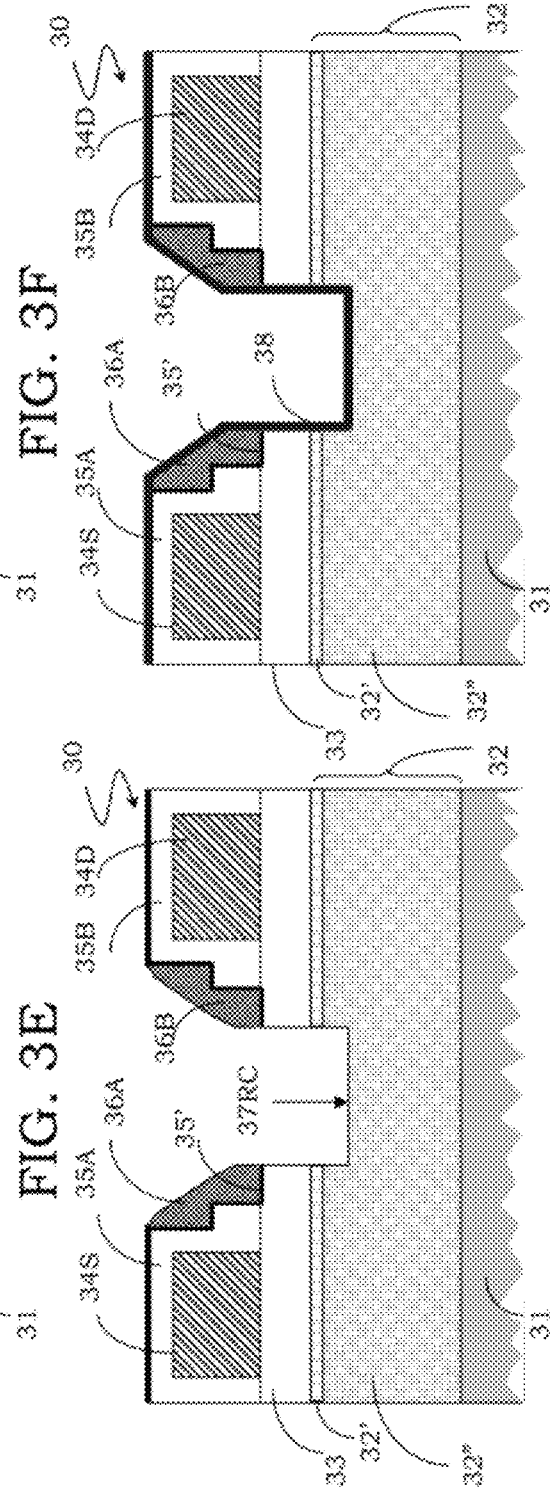

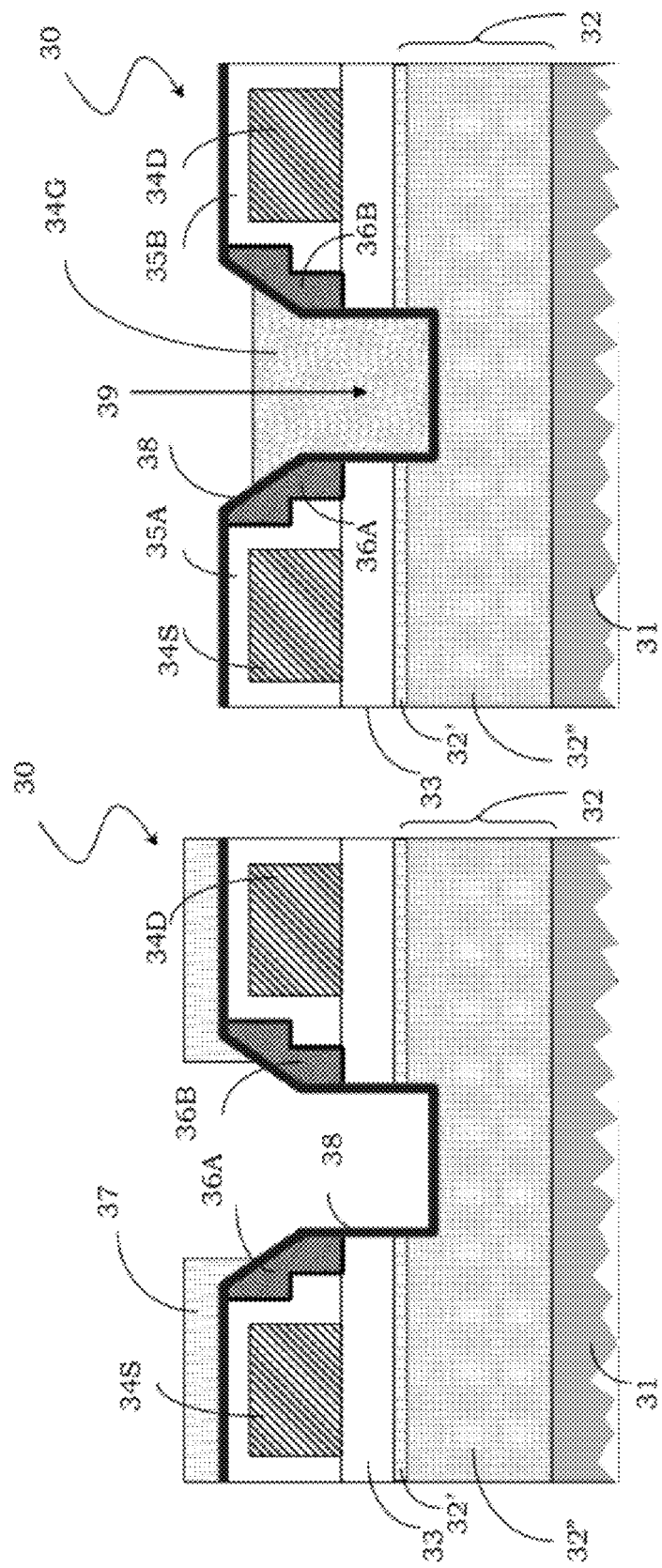

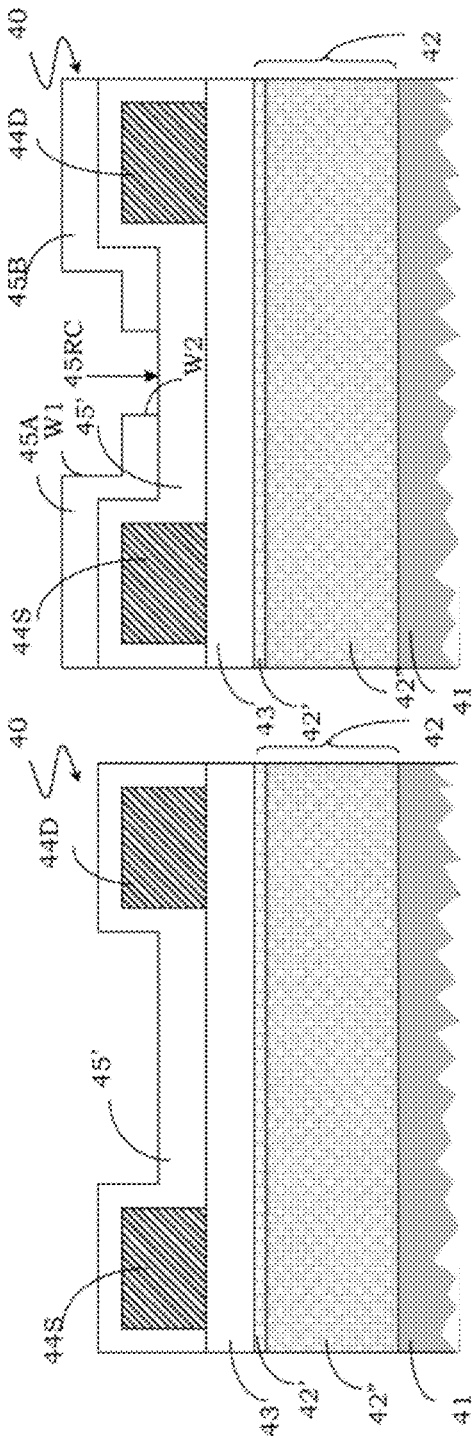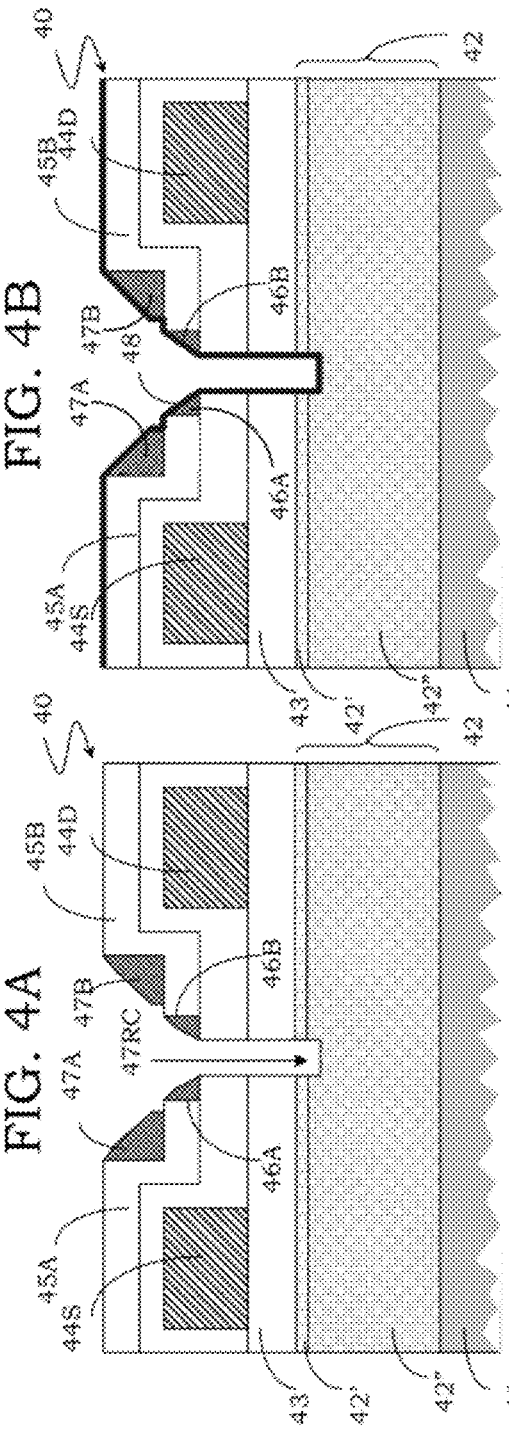

METHOD FOR MANUFACTURING A HEMT TRANSISTOR AND CORRESPONDING HEMT TRANSISTOR

BACKGROUND

1. Technical Field

The present disclosure relates to a method for manufacturing an HEMT transistor. The disclosure also relates to a HEMT transistor.

2. Description of the Related Art

As it is well known, a high electron mobility transistor (HEMT) substantially is a field effect transistor including a channel region realized by a junction between two materials having different band gaps, i.e., a heterojunction. The HEMT transistor is then also known as heterostructure FET (HFET).

In particular, by employing two semiconductor materials with different band-gaps, an electron potential well is formed at the hetero-interface between the used materials. The electrons are confined in this potential well to form a two-dimensional electron gas.

The fundamental characteristic of a HEMT transistor is the conduction band offset between the materials which realize the barrier and channel layers, that is, the barrier layer has a higher conduction band while the channel layer has a lower conduction band. In this way, a potential well is formed which can contain a large number of electrons to form a two-dimensional electron gas channel at the hetero-interface due to this conduction band offset.

Wide-bandgap semiconductors are especially promising for realizing HEMT transistors, in particular gallium nitride and indium gallium. Devices incorporating indium generally show better high-frequency performance, while in recent years, devices incorporating gallium nitride have attracted attention due to their high-power performance.

High mobility two dimensional electron gas is generated using a heterojunction of a highly-doped wide-bandgap n-type donor-supply layer and a non-doped narrow-bandgap channel layer with no dopant impurities.

A widely used material combination is a thin layer of aluminum gallium nitride, AlGaN, being n-doped and a non-doped layer of gallium nitride, GaN.

In this case, electrons generated in the thin n-type AlGaN layer drop completely into the GaN layer to form a depleted AlGaN layer, because the so created heterojunction forms a quantum well (a steep canyon) in the conduction band on the GaN layer side where the electrons can move quickly without colliding with any impurities, the GaN layer being undoped, and from which they cannot escape. In this way, a very thin layer of highly mobile conducting electrons with very high concentration is created, giving the channel of the transistor so formed a very low resistivity and a high electron mobility.

HEMT transistors comprising an AlGaN/GaN heterojunction are devices that can operate at high power, at high speed and in a high temperature environment. The high performance of a device of this kind is achieved, for instance, by using depletion-mode (D-mode) HEMT transistors, in which the threshold voltages typically range between −4V and −8V.

Also known are the enhancement-mode (E-mode) HEMT transistors, which have a simple circuit design thanks to the elimination of the negative voltage supply and a low standby power dissipation during switching, being normally off, as described in the article to N. Ikeda entitled: "Normally-Off Operation Power AlGaN/GaN HFET", *Proc. Int. Symp. Power Semicond. Devices and ICs*, pp. 369-372, 2004.

Various technologies for developing normally off devices which uses a Schottky junction gate or a MOS gate structure are also described in the article to H. Kambayashi entitled: "Normally-Off N-Channel GaN MOSFETs on Si Substrates Using an SAG Technique and Ion Implantation", *IEEE Electron Device Lett.*, vol. 28, no. 12, pp. 1077-1079, December 2007.

High-voltage AlGaN/GaN HEMT transistors have been so far manufactured using multiple field plates over dielectric passivation layers, the device breakdown voltage increasing with the addition of the field plates. In particular, the manufacturing of these devices has been performed using the well known stepper lithography, which has the advantages of a consolidated technique and allows to achieve a high throughput.

Alternatively, to guarantee high RF performance, E-Beam lithography may be used for aggressive critical dimensions. In this case, a very low-throughput is obtained, also for the fact that this technique is not a consolidated process.

Also known from the U.S. patent application published under No. 1 921 669 in the name of Cree, Inc. is a GaN based HEMT with buried field plates. Moreover, the European patent application published under No. 1 965 433 still in the name of Cree, Inc. describes a high voltage GaN transistor having multiple field plates realized on different spacers. The transistor structures described and illustrated in these patent applications comprise an insulating layer which has spacer-like structures.

An E-mode AlGaN/GaN HEMT transistor of the known type is schematically shown in FIG. 1, globally indicated with 100. The E-mode HEMT transistor 100 in particular comprises a p-doped GaN buffer layer and an over-recessed gate that have been realized by etching the barrier layer being under a gate metal structure of the E-mode HEMT transistor 100, in this way increasing the threshold voltage due to depletion effect and reducing the buffer leakage current, as described in the article to Ki-Sik Im entitled: "Normally Off GaN MOSFET Based on AlGaN/GaN Heterostructure With Extremely High 2DEG Density Grown on Si Substrate", *IEEE Electron Device Lett.*, Vol. 31, no. 3, March 2010 and in the article to Dong-Seok Kim entitled: "Normally-Off Operation of Al2O3/GaN MOSFET Based on AlGaN7GaN Heterostructure With p-GaN Buffer Layer", *Proceedings of the 22nd International Symposium on Power Semiconductor Devices & ICs*, Hiroshima, NM-P5.

With reference of FIG. 1, the E-mode HEMT transistor 100 comprises a substrate 1, made of silicon or silicon carbide or sapphire, for instance, covered by a buffer layer 2, in turn covered by the series of a bottom transition layer 3 and a top transition layer 4. Other type of material may be used for realizing the substrate 1.

On the top transition layer 4, the E-mode HEMT transistor 100 comprises a highly resistive layer 5 made of n-type gallium nitride, GaN as well as a first and a second portion, 6A and 6B respectively, of a layer made of aluminum gallium nitride, AlGaN.

The E-mode HEMT transistor 100 further comprises a source structure and a drain structure, 8S and 8D respectively, realized on the first and second portions, 6A and 6B respectively, of the AlGaN layer, as well as a gate structure 8G, realized over the GaN layer 5 and separated therefrom by an insulator layer 7, being a dielectric with high-K like $Al_2O_3$, $HfO_2$, $ScO_2$, etc. In particular, the gate structure 8G is realized in correspondence with a recessed portion 5RP of the GaN layer 5.

As above explained, at the interfaces between the portions 6A and 6B of the AlGaN layer and the GaN layer 5, a first and a second two-dimensional electron gas channel are obtained, indicated in FIG. 1 with 9A and 9B, respectively.

The dimension of the gate structure is still a critical parameter influencing the maximum working frequency of the HEMT transistor itself.

BRIEF SUMMARY

Some embodiments of the present disclosure provide a manufacturing method and a corresponding HEMT transistor having structural and functional characteristics which allow to reduce in a simple way the size of the gate structure, in this way overcoming the limits which still affect the devices realized according to the prior art.

One embodiment of the present disclosure uses sidewall spacer gates being realized by etching an insulating layer.

It should be remarked that a shaped gate electrode realized over dielectric spacers reduces the gate-source capacitance Cgs and gate-drain capacitance Cgd, in this way improving the RF characteristics of the HEMT transistor so obtained and reducing its breakdown voltage due to the reduced electron field concentration between the gate and drain electrodes.

One embodiment of the present disclosure is a method for manufacturing a HEMT transistor of the type comprising the steps of:
providing a substrate;
realizing an epitaxial layer on said substrate;
realizing a barrier epitaxial layer on said epitaxial layer so as to form a heterojunction;
realizing a source structure and a drain structure, separated one other, on said barrier epitaxial;
depositing an insulating layer on said barrier epitaxial layer and on said source and drain structures; and
photolithographic defining and etching said insulating layer defining a first and a second portion in correspondence of said source and drain structures, respectively, and exposing a portion of said barrier epitaxial layer.

The method also includes:
depositing and photolithographic defining at least a first and a second spacer lying at the corners of said first and second portions of said insulating layer; and
defining a gate metal structure at least partially covering said first and second portions of said insulating layer, as well as said first and second spacers, said gate metal structure having a shaped profile and acting as a field plate of said HEMT transistor.

More in particular, the disclosure comprises the following supplemental and optional features, taken alone or in combination when needed.

According to an aspect of the disclosure, said step of defining said gate metal structure may be realized in correspondence of a contact gate area between said first and second spacers.

According to another aspect of the disclosure, the method may further comprise, before said step of defining a gate metal structure, a step of depositing a dielectric layer at least partially covering said first and second portions of said insulating layer, as well as said first and second spacers, said gate metal structure being defined on said dielectric layer.

According to yet another aspect of the disclosure, the method may further comprise, before said step of depositing a dielectric layer, a step of defining by etching a deeply recessed portion extending in said epitaxial layer and at least partially in said barrier epitaxial layer in correspondence of said contact gate area between said first and second portions of said insulating layer.

Moreover, according to this aspect of the disclosure, said step of depositing said dielectric layer may realize said dielectric layer covering the walls and bottom of said deeply recessed portion.

According to an aspect of the disclosure, said step of defining said gate metal structure on said dielectric layer may be realized in correspondence of said deeply recessed portion.

According to another aspect of the disclosure, the method may further comprise, after said step of depositing and photolithographic defining at least a first and a second spacer, a step of optional etching which defines a recessed portion of said barrier epitaxial layer in correspondence of a portion thereof being left exposed between said first and second spacers.

Moreover, according to an aspect of the disclosure, the method may further comprise, after said step of depositing and photolithographic defining at least a first and a second spacer, a step of depositing and photolithographic defining at least a third and a fourth spacer, on said first and second spacers, a narrow portion of said barrier epitaxial layer being left exposed between said third and fourth spacers with respect to the portion being left exposed between said first and second spacers.

According to this aspect of the disclosure, the method may further comprise, before said step of depositing a dielectric layer, a step of removing said third and fourth spacers.

Moreover, according to another aspect of the disclosure, said step of defining said gate metal structure may realize said gate metal structure so as to completely fill said deeply recessed portion and to at least partially overlie said dielectric layer on said first and second portions of said insulating layer.

According to yet another aspect of the disclosure, said step of defining said gate metal structure may comprise a deposition and photolithographic definition step of a gate metal layer in said deeply recessed portion so as to define a contact gate recessed portion, an evaporation step of said gate metal layer and a lift-off definition step of said gate metal layer so as to obtain said gate metal structure.

According to an aspect of the disclosure, the method may further comprise, after said step of photolithographic defining and etching said insulating layer defining first and second portions thereof, a step of depositing an insulating layer, which covers said first and second portions and a left exposed portion of said barrier epitaxial layer.

Moreover, according to this aspect of the disclosure, the method may further comprise, after said step of depositing and photolithographic defining said first and second spacers, a step of etching which removes a portion of said insulating layer being left exposed between said first and second spacers.

Yet according to this aspect of the disclosure, said step etching which removes a portion of said insulating layer being left exposed between said first and second spacers may be an etching in wet.

Moreover, according to another aspect of the disclosure, said step of defining said gate metal structure may realize said gate metal structure so as to at least partially fill said deeply recessed portion.

According to yet another aspect of the disclosure, said step of defining said gate metal structure may comprise a deposition and definition step of a gate metal layer in said deeply recessed portion, by means of a photoresist layer, an evaporation step of said gate metal layer and a lift-off definition step of said gate metal layer so as to obtain said gate metal structure in correspondence with a contact gate recessed portion in an area between said first and second spacers, said gate metal structure at least partially filling said contact gate recessed portion.

As an alternative, according to an aspect of the disclosure, said step of defining said gate metal structure may comprise a sputtering, a lithographic definition and an etching of a gate metal layer.

Moreover, according to an aspect of the disclosure, the method may further comprise, before said step of depositing an insulating layer, a step of depositing an intermediate insulating layer on the barrier epitaxial layer and on said source and drain structures.

According to another aspect of the disclosure, said photolithographic defining and etching said insulating layer defines said first and second portions with an L-shaped terminal portion having a first wall on said insulating layer and a second wall in correspondence of a corner of said L-shaped terminal portion and in that said step of depositing and photolithographic defining said first and second spacers further defines a third and a fourth spacer, said first and second spacers lying on said intermediate insulating layer in correspondence of said first walls of said first and second portions of said insulating layer and said third and fourth spacers lying on said insulating layer in correspondence of said second walls of said first and second portions thereof.

According to this aspect of the disclosure, said step of defining said gate metal structure may comprise a deposition and definition step of a gate metal layer in said deeply recessed portion, an evaporation step of said gate metal layer and a lift-off definition step of said gate metal layer so as to obtain said gate metal structure in correspondence with a contact gate recessed portion between said first and second spacers, said gate metal structure at least partially filling said contact gate recessed portion.

As an alternative, according to an aspect of the disclosure, said step of defining said gate metal structure may comprise a sputtering, a lithographic definition and an etching of a gate metal layer.

Moreover, according to an aspect of the disclosure, said step of depositing and photolithographic defining said first and second spacers may comprise a step of depositing a polysilicon layer.

According to another aspect of the disclosure, said step of depositing said dielectric layer may comprise an atomic layer deposition.

According to yet another aspect of the disclosure, said step of realizing an epitaxial layer may comprises realizing a gallium nitride layer and said step of realizing a barrier epitaxial layer comprises realizing a aluminum gallium nitride layer.

Finally, according to a further aspect of the disclosure, said step of realizing an epitaxial layer may comprise realizing an n-type epitaxial layer and a p-type epitaxial layer, said n-type epitaxial layer being realized in contact with said barrier epitaxial layer.

One embodiment of the present disclosure is a HEMT transistor that includes:
  a heterojunction comprising an epitaxial layer and a barrier epitaxial layer; and
  a source structure and a drain structure lying on said barrier epitaxial layer and being covered by respective portions of an insulating layer.

The transistor also includes:
  at least a first and a second spacer being on said barrier epitaxial layer at the corners of the said first and second portions of said insulating layer; and
  a gate metal structure being in correspondence of a contact gate portion between said first and second portions of said insulating layer, said gate metal structure being at least partially on said first and second portions of said insulating layer, as well as on said first and second spacers,
  said gate metal structure having a shaped profile and acting as a field plate of said HEMT transistor.

According to an aspect of the disclosure, the HEMT transistor may further comprise, under said gate metal structure, a said dielectric layer being at least partially on said first and second portions of said insulating layer, as well as on said first and second spacers, said gate metal structure being in correspondence of a contact gate area between said first and second spacers.

Moreover, according to another aspect of the disclosure, the HEMT transistor may further comprise, under said dielectric layer, at least a deeply recessed portion extending in said epitaxial layer and at least partially in said barrier epitaxial layer in correspondence of said contact gate area between said first and second portions of said insulating layer.

According to an aspect of the disclosure, said dielectric layer may be on the walls and bottom of said deeply recessed portion.

According to an aspect of the disclosure, said gate metal structure may be on said dielectric layer in correspondence of said deeply recessed portion.

According to another aspect of the disclosure, said gate metal structure may fill said deeply recessed portion and at least partially overlies said dielectric layer on said first and second portions of said insulating layer covering said source and drain structure.

Moreover, according to an aspect of the disclosure, the transistor may further comprise a first and a second portion of an intermediate layer interposed between said portions of said insulating layer and said source and drain structure.

According to another aspect of the disclosure, said first and second portions of said insulating layer may have an L-shaped terminal portion having a first wall on said insulating layer and a second wall in correspondence of a corner of said L-shaped terminal portion.

According to yet another aspect of the disclosure, the transistor may further comprise a third and a fourth spacer, said first and second spacers lying on said intermediate insulating layer in correspondence of said first walls of said first and second portions of said insulating layer and said third and fourth spacers lying on said insulating layer in correspondence of said second walls of said first and second portions thereof.

Finally, according to a further aspect of the disclosure, said epitaxial layer may comprise an n-type epitaxial layer and a p-type epitaxial layer, said n-type epitaxial layer being in contact with said barrier epitaxial layer.

BRIEF DESCRIPTION OF THE SEVERAL VIEWS OF THE DRAWINGS

In such drawings:
FIGS. 1A-1D schematically show a first embodiment of a HEMT transistor realized according to the disclosure at different steps of its manufacturing method;
FIGS. 2A-2I schematically show a second embodiment of a HEMT transistor realized according to the disclosure at different steps of its manufacturing method;

FIGS. 3A-3J schematically show a third embodiment of a HEMT transistor realized according to the disclosure at different steps of its manufacturing method; and FIGS. 4A-4E schematically show a fourth embodiment of a HEMT transistor realized according to the disclosure at different steps of its manufacturing method.

DETAILED DESCRIPTION

With reference to such figures, and in particular to FIGS. 1A-1H, a HEMT transistor realized according to a first embodiment of the disclosure will be explained, with reference to the different steps of its manufacturing method. The HEMT transistor is globally indicated with 10.

It should be noted that the method steps being described hereinafter do not form a complete manufacturing process of integrated circuits. The present disclosure can be carried out along with the manufacturing techniques of integrated circuits that are usually employed in the field.

Moreover, figures showing schematic views of integrated structures during the manufacturing are not drawn in scale, being on the contrary drafted so as to emphasize the important features of the disclosure.

In the following description, numerous specific details are given to provide a thorough understanding of embodiments. The embodiments can be practiced without one or more of the specific details, or with other methods, components, materials, etc. In other instances, well-known structures, materials, or operations, are not shown or described in detail to avoid obscuring aspects of the embodiments.

Furthermore, the particular features, structures, or characteristics may be combined in any suitable manner in one or more embodiments.

Figure 1:
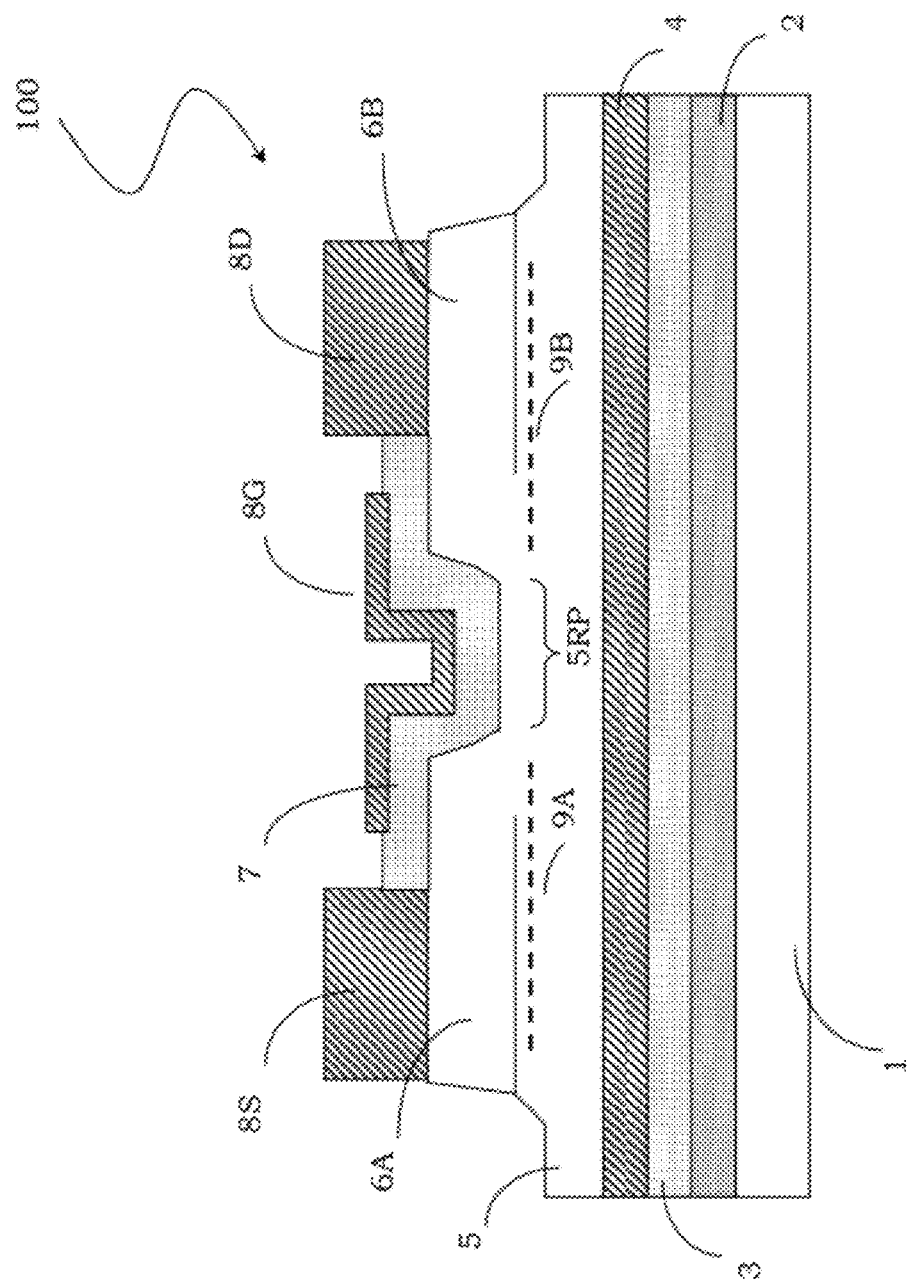
FIG. 1 schematically shows an E-mode HEMT transistor realized according to the prior art.

As shown in FIG. 1A, the HEMT transistor 10 is obtained by the following initial steps:
- providing a substrate 11, made of silicon, silicon carbide or sapphire, for example, or other materials;
- realizing an epitaxial layer 12 made of gallium nitride, GaN, on the substrate 11;
- realizing a barrier epitaxial layer 13 made of aluminum gallium nitride, AlGaN. on the epitaxial layer 12;
- realizing a source structure 14S and a drain structure 14D, separated one other, on the barrier epitaxial layer 13; and
- depositing an insulating layer, in particular a nitride layer 15, on the barrier epitaxial layer 13 and on the source and drain structures, 14A and 14D.

In particular, the barrier epitaxial layer 13 may be a doped or an epitaxial layer.

Moreover, the epitaxial layer 12 may comprise an n-type epitaxial layer 12' and a p-type epitaxial layer 12", the former being in contact with the barrier epitaxial layer 13.

The heterojunction realized by the epitaxial layer 12 and the barrier epitaxial layer 13 creates a two-dimensional electron gas channel 12CH at the interface between these materials. In particular, the two-dimensional electron gas channel 12CH is created at the interface between the barrier epitaxial layer 13 and the n-type epitaxial layer 12' of the epitaxial layer 12.

The method further comprises a photolithographic definition and etching step of the nitride layer 15 which realizes a recess 15RC, exposing a portion of the barrier epitaxial layer 13 and defining a first and a second portion, 15A and 15B, of the nitride layer 15, as shown in FIG. 1B.

The method then comprises depositing and photolithographically defining a spacer layer to obtain at least a first and a second spacer, 16A and 16B, on the barrier epitaxial layer 13, these spacers lying at the corners of the first and second portions, 15A and 15B, of the nitride layer 15, in correspondence with the ends of the recess 15RC, as shown in FIG. 1C.

In particular, the first and second spacers, 16A and 16B, are made of silicon nitride or other dielectric materials.

Finally, the method comprises a step of defining a gate metal structure 14G which is realized on the first and second spacers, 16A and 16B and on an area thereof between them. In particular, the gate metal structure 14G is realized so as to also at least partially overlie the first and second portions, 15A and 15B, of the nitride layer 15 covering the source and drain structure, 14S and 14D, as shown in FIG. 1D.

The gate metal structure 14G suppresses unwanted gate current and simultaneously enhances the parasitic influence on the frequency performance of the HEMT transistor as a whole. In particular, the gate metal structure 14G has a shaped profile and acts as a field plate of the HEMT transistor.

In particular, the step of defining the gate metal structure 14G comprises forming a patterned photoresist layer (not shown) on the first and second insulating portions 15A, 15B, depositing by evaporation a gate metal layer so as to define a contact gate portion, and a lift-off definition step. Alternatively, one could deposit the gate metal layer on the entire top surface and perform a lithographic definition with an etching step of the gate metal layer so as to obtain the gate metal structure 14G.

In this way a HEMT transistor 10 is obtained. According to an aspect of the disclosure, the HEMT transistor 10 hence comprises:
- a heterojunction comprising an epitaxial layer 12 and a barrier epitaxial layer 13;
- a source structure 14S and a drain structure 14D lying on the barrier epitaxial layer 13 and being covered by respective portions, 15A and 15B, of a nitride layer 15; and
- a gate metal structure 14G in correspondence of a contact gate portion between the portions, 15A and 15B, of the nitride layer 15 and at least partially covering them.

The HEMT transistor 10 also comprises at least first and second spacers 16A and 16B on the barrier epitaxial layer 13 at the corners of the contact gate portion between the portions 15A and 15B of the nitride layer 15 covering the source and drain structures 14S and 14D, and covered by the gate metal structure 14G.

In this way, the gate metal structure 14G on the first and second spacers, 16A and 16B and at least partially on the portions, 15A and 15B, of the nitride layer 15 has a shaped profile and acts as a field plate of the HEMT transistor 10.

Moreover, the epitaxial layer 12 may comprise an n-type epitaxial layer 12' and a p-type epitaxial layer 12", the former being in contact with the barrier epitaxial layer 13.

It should be thus remarked that the size of the recess 15RC is tied to the photolithographic process used to define it.

A second embodiment of the manufacturing method according to the present disclosure is described with reference to FIGS. 2A-2I.

As shown in FIG. 2A, a HEMT transistor, globally indicated with 20, is obtained by the following initial steps:
- providing a substrate 21, made of silicon, silicon carbide or sapphire, for example, or other materials;
- realizing an epitaxial layer 22 made of gallium nitride, GaN, on the substrate 21;
- realizing a barrier epitaxial layer 23 made of aluminum gallium nitride, AlGaN. on the epitaxial layer 22;
- realizing a source structure 24S and a drain structure 24D, separated from one other, on the barrier epitaxial layer 23; and depositing an insulating layer, in particular a nitride layer 25 on the barrier epitaxial layer 23 and on the source and drain structures, 24A and 24D.

In particular, the barrier epitaxial layer 23 may be a doped or an epitaxial layer.

Moreover, the epitaxial layer 22 may comprise an n-type epitaxial layer 22' and a p-type epitaxial layer 22", the former being in contact with the barrier epitaxial layer 23.

Also in this case, the HEMT transistor 20 comprises an heterojunction realized by the epitaxial layer 22 and the barrier epitaxial layer 23.

Thus, the initial steps of the method according to the second embodiment fully correspond to the initial steps of the method according to the first embodiment and described with reference to FIG. 1A.

The method further comprises a photolithographic definition and etching step of the nitride layer 25 which realizes a recess 25RC, exposing a portion of the barrier epitaxial layer 23 and defining a first and a second portion, 25A and 25B, of the nitride layer 25, as shown in FIG. 2B.

The method then comprises a step of deposition and photolithographic definition of at least a first and a second spacer, 26A and 26B, on the barrier epitaxial layer 23, these spacers lying at the corners of the first and second portions, 25A and 25B, of the nitride layer 25, in correspondence of the ends of the recess 25RC, as shown in FIG. 2C. In particular, the first and second spacers, 26A and 26B, are made of silicon nitride or other dielectric materials.

According to this second embodiment of the disclosure, a further optional etching step defines a recessed portion 23RC of the barrier epitaxial layer 23 in correspondence of a portion thereof left exposed between the spacers, 26A and 26B, shown in FIG. 2D. With D being the thickness of the recessed portion 23RC, it is clear that:

if D=0, a normally-on HEMT transistor could be obtained;
if D=a fraction of the thickness of the barrier epitaxial layer 23, a normally-off HEMT transistor could be obtained having a recessed gate, reduced values of the gate-source capacitance Cgs and gate-drain capacitance Cgd as well as a gradual field plate.

According to an aspect of the disclosure, the method then comprises a further step of deposition and photolithographic definition of at least a third and a fourth spacer, 27A and 27B, on the first and second spacers, 26A and 26B, which leaves exposed a narrow portion of the barrier epitaxial layer 23, in particular of its recessed portion 23RC, as shown in FIG. 2E. In particular, the third and fourth spacers, 27A and 27B, are made of a dielectric material.

It should be remarked that the portion of the barrier epitaxial layer 23, or of its recessed portion 23RC, left exposed by the third and fourth spacers, 27A and 27B, defines a contact region of the gate metal structure of the HEMT transistor 20 so obtained, such contact region having a reduced size with respect to a region obtained by an optical lithography according to the prior art, thereby reducing the gate charge.

A further optional etching step defines a deeply recessed portion 27RC in correspondence of the portion of the barrier epitaxial layer 23 left exposed between the third and fourth spacers, 27A and 27B, shown in FIG. 2F. In particular, the deeply recessed portion 27RC extends through the barrier epitaxial layer 23 and at least a thickness fraction of the epitaxial layer 22 and is realized by a dry etching step.

According to an aspect of the disclosure, the method comprises a step of removing the third and fourth spacers, 27A and 27B, as shown in FIG. 2G and then the step of deposition of a dielectric layer 28, in particular realized by an Atomic Layer Deposition or ALD, as shown in FIG. 2H. The thickness of the dielectric layer 28 ranges between 5 and 100 nm. The dielectric layer 28 at least partially covers the first and second portions, 25A and 25B, of the nitride layer 25, the first and second spacers, 26A and 26B, as well as the walls and bottom of the deeply recessed portion 27RC.

Finally, the method comprises a step of defining a gate metal structure 24G on the dielectric layer 28 in correspondence of the deeply recessed portion 27RC. In particular, the gate metal structure 24G is realized so as to fill the deeply recessed portion 27RC and to at least partially overlie the dielectric layer 28 on the first and second portions, 25A and 25B, of the nitride layer 25 covering the source and drain structure, 24S and 24D.

The gate metal structure 24G on the dielectric layer 28 suppresses unwanted gate current and simultaneously enhances the parasitic influence on the frequency performance of the HEMT transistor as a whole. In particular, the gate metal structure 24G on the dielectric layer 28 has a shaped profile and acts as a field plate of the HEMT transistor.

Figure 2I:
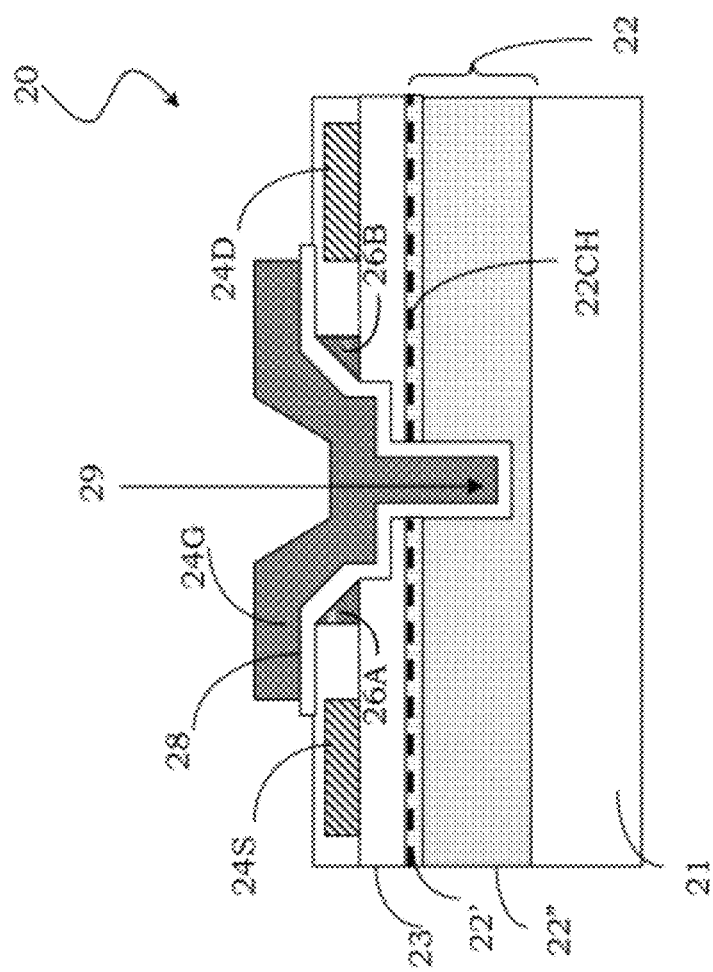

In particular, the step of defining the gate metal structure 24G comprises forming a patterned photoresist layer (not shown) on the first and second insulating portions 25A, 25B, depositing by evaporation a gate metal layer in the deeply recessed portion 27RC so as to define a contact gate recessed portion 29, and a lift-off definition step. Alternatively, one could deposit the gate metal layer on the entire top surface and perform a lithographic definition with an etching step of the gate metal layer so as to obtain the gate metal structure 24G, as shown in FIG. 2I.

In this way a HEMT transistor 20 is obtained. According to an aspect of the disclosure, the HEMT transistor 20 hence comprises:

a heterojunction comprising an epitaxial layer 22 and a barrier epitaxial layer 23;
a source structure 24S and a drain structure 24D lying on the barrier epitaxial layer 23 and being covered by respective portions, 25A and 25B, of a nitride layer 25;
a dielectric layer 28 on a contact gate recessed portion 29 extending in the epitaxial layer 22 and at least partially in the barrier epitaxial layer 23 in correspondence of an area between the portions, 25A and 25B, of the nitride layer 25 covering the source and drain structures, 24S and 24D, as well as
a gate metal structure 24G being on the dielectric layer 28 in correspondence of the contact gate recessed portion 29.

In particular, the gate metal structure 24G fills the deeply recessed portion 27RC and at least partially overlies the dielectric layer 28 on the first and second portions, 25A and 25B, of the nitride layer 25 covering the source and drain structure, 24S and 24D.

According to an aspect of the disclosure, the HEMT transistor 20 also comprises at least first and second spacers, 26A and 26B, being on the barrier epitaxial layer 23 at the corners of the portions, 25A and 25B, of the nitride layer 25 covering the source and drain structures, 24S and 24D, facing the contact gate recessed portion 29 and being covered by the dielectric layer 28.

Moreover, the epitaxial layer 22 may comprise an n-type epitaxial layer 22' and a p-type epitaxial layer 22", the former being in contact with the barrier epitaxial layer 13.

It should be remarked that according to the disclosure the first and second spacers, 26A and 26B are not removed and covered by the dielectric layer 28. In this way, the dielectric spacers allow to reduce the gate-source capacitance Cgs and the gate-drain capacitance Cgd.

Moreover, the first and second spacers allow to realize a gradual field plate with a spreading of the electric field that improves the breakdown voltage of the HEMT transistor 20 so obtained. In particular, the gate metal structure 24G on the dielectric layer 28 has a shaped profile and acts as a field plate of the HEMT transistor 20.

A third embodiment of the manufacturing method according to the present disclosure is described with reference to FIGS. 3A-3L.

As shown in FIG. 3A, a HEMT transistor, globally indicated with 30, is obtained by the following initial steps:
- providing a substrate 31, made of silicon, silicon carbide or sapphire, for example, or other materials;
- realizing an epitaxial layer 32 made of gallium nitride, GaN, on the substrate 31;
- realizing a barrier epitaxial layer 33 made of aluminum gallium nitride, AlGaN. on the epitaxial layer 32;
- realizing a source structure 34S and a drain structure 34D, separated one other, on the barrier epitaxial layer 33; and
- depositing an insulating layer, in particular a nitride layer 35 on the barrier epitaxial layer 33 and on the source and drain structures, 34A and 34D.

In particular, the barrier epitaxial layer 33 may be a doped or an epitaxial layer.

Moreover, the epitaxial layer 32 may comprise an n-type epitaxial layer 32' and a p-type epitaxial layer 32", the former being in contact with the barrier epitaxial layer 13.

Also in this case, the HEMT transistor 30 comprises an heterojunction realized by the epitaxial layer 32 and the barrier epitaxial layer 33.

Thus, the initial steps of the method according to the third embodiment fully correspond to the initial steps of the method according to the first and second embodiments and described with reference to FIG. 1A and FIG. 2A.

The method further comprises a photolithographic definition and etching step of the nitride layer 35 which realizes a recess 35RC, exposing a portion of the barrier epitaxial layer 33 and defining a first and a second portion, 35A and 35B, of the nitride layer 35, as shown in FIG. 3B.

According to this third embodiment of the disclosure, the method then comprises a step of deposition of an insulating layer 35', in particular a thin nitride layer, which covers the first and second portions, 35A and 35B, of the nitride layer 35 and the exposed portion of the barrier epitaxial layer 33, as shown in FIG. 3C.

The method then comprises a step of deposition of a polysilicon layer 36, as shown in FIG. 3D, followed by a step of photolithographic definition of this polysilicon layer 36 so as to obtain at least a first and a second spacer, 36A and 36B, on the insulating layer 35', these spacers lying at the corners of the first and second portions, 35A and 35B, of the nitride layer 35, in correspondence of the ends of the recess 35RC, as shown in FIG. 3E.

A further optional etching step removes the portion of the insulating layer 35' left exposed between the first and second spacers, 36A and 36B, shown in FIG. 3F. In particular, this step comprises a wet etching step.

It should be remarked that the portion of the barrier epitaxial layer 33 left exposed by the first and second spacers, 36A and 36B when the insulating layer 35' has been removed therefrom, defines a contact region of the gate metal structure of the HEMT transistor 30 so obtained, such contact region having a reduced size with respect to a region obtained by an optical lithography according to the prior art, thereby reducing the gate charge.

A further etching step defines a deeply recessed portion 37RC in correspondence of the portion of the barrier epitaxial layer 33 left exposed between the first and second spacers, 36A and 36B, as shown in FIG. 3G. In particular, the deeply recessed portion 37RC extends through the barrier epitaxial layer 33 and at least a thickness fraction of the epitaxial layer 32 and is realized by a dry etching step.

According to an aspect of this third embodiment of the disclosure, the method comprises a step of deposition of a dielectric layer 38, in particular realized by an Atomic Layer Deposition or ALD. The thickness of the dielectric layer 38 ranges between 5 and 100 nm as shown in FIG. 3H. The dielectric layer 38 covers the insulating layer 35' in correspondence of the first and second portions, 35A and 35B, of the nitride layer 35, the first and second spacers, 36A and 36B, as well as the walls and bottom of the deeply recessed portion 37RC.

Moreover, the method comprises a step of defining a gate metal structure 34G on the dielectric layer 38 in correspondence of the deeply recessed portion 37RC. In particular, the gate metal structure 34G is realized so as to at least partially fill the deeply recessed portion 37RC.

Prior to forming the gate metal structure 34G in the deeply recessed portion 37RC, the method forms a photoresist layer 37, as shown in FIG. 3I. Next, the method deposits by evaporation a gate metal layer and performs a lift-off definition step of the gate metal layer so as to obtain the gate metal structure 34G in correspondence with a contact gate recessed portion 39, the gate metal structure 34G at least partially filling the contact gate recessed portion 39, as shown in FIG. 3J. A sputtering, a lithographic definition and an etching of the gate metal layer can be also used to realize the gate metal structure 34G.

The gate metal structure 34G on the dielectric layer 38 suppresses unwanted gate current and simultaneously enhances the parasitic influence on the frequency performance of the HEMT transistor as a whole. In particular, the gate metal structure 34G on the dielectric layer 38 has a shaped profile and acts as a field plate of the HEMT transistor.

In this way a HEMT transistor 30 is obtained. According to an aspect of the disclosure, the HEMT transistor 30 hence comprises:
- a heterojunction comprising an epitaxial layer 32 and a barrier epitaxial layer 33;
- a source structure 34S and a drain structure 34D lying on the barrier epitaxial layer 33 and being covered by respective portions, 35A and 35B, of a nitride layer 35;
- a dielectric layer 38 on the portions, 35A and 35B, of the nitride layer 35 covering the source and drain structures, 34S and 34D and on a contact gate recessed portion 39 extending in the epitaxial layer 32 and at least partially in the barrier epitaxial layer 33 in correspondence of an area between these portions, 35A and 35B, of the nitride layer 35, as well as
- a gate metal structure 34G on the dielectric layer 38 in correspondence of the contact gate recessed portion 39.

In particular, the gate metal structure 34G at least partially fills the contact gate recessed portion 39.

Moreover, the epitaxial layer 32 may comprise an n-type epitaxial layer 32' and a p-type epitaxial layer 32", the former being in contact with the barrier epitaxial layer 33.

According to an aspect of the disclosure, the HEMT transistor 30 also comprises at least first and second spacers, 36A and 36B, on the barrier epitaxial layer 33 at the corners of the portions, 35A and 35B, of the nitride layer 35 facing the contact gate recessed portion 39 and covered by the dielectric layer 38.

In this way, the gate metal structure 34G has a shaped profile and acts as a field plate of the HEMT transistor 30.

A fourth embodiment of the manufacturing method according to the present disclosure is described with reference to FIGS. 4A-4E.

As shown in FIG. 4A, a HEMT transistor, globally indicated with 40, is obtained by the following initial steps:
- providing a substrate 41, made of silicon, silicon carbide or sapphire, for example, or other materials;
- realizing an epitaxial layer 42 made of gallium nitride, GaN, on the substrate 41;
- realizing a barrier epitaxial layer 43 made of aluminum gallium nitride, AlGaN. on the epitaxial layer 42;
- realizing a source structure 44S and a drain structure 44D, separated one other, on the barrier epitaxial layer 43; and
- depositing an intermediate insulating layer, in particular a nitride layer 45' on the barrier epitaxial layer 43 and on the source and drain structures, 44A and 44D.

In particular, the barrier epitaxial layer 43 may be a doped or an epitaxial layer.

Moreover, the epitaxial layer 42 may comprise an n-type epitaxial layer 42' and a p-type epitaxial layer 42", the former being in contact with the barrier epitaxial layer 43.

Thus, also according to this fourth embodiment, the HEMT transistor 40 comprises an heterojunction realized by the epitaxial layer 42 and the barrier epitaxial layer 43.

The initial steps of the method according to this embodiment fully correspond to the initial steps of the methods according to the first, second and third embodiments and described with reference to FIGS. 1A, 2A and 3A, respectively.

The method further comprises a deposition step of depositing an insulating layer 45, in particular a silicon oxide layer.

This deposition step is followed by a photolithographic definition and etching step of the insulating layer 45 so as to realize a recess 45RC, exposing a portion of the intermediate nitride layer 45 and defining a first and a second portion, 45A and 45B, of the insulating layer 45 in substantial correspondence of the source and drain structures, 44S and 44D, as shown in FIG. 4B. In particular, the first and second portions, 45A and 45B, of the insulating layer 45 have a stepped configuration. More in particular, each portion has an L-shaped terminal portion having a first wall W1 on the insulating layer 45 and a second wall W2 in correspondence of a corner of this L-shaped terminal portion.

According to this fourth embodiment of the disclosure, the method then comprises a step of deposition of a polysilicon or silicon oxide layer on the first and second portions, 45A and 45B, of the insulating layer 45 and on the portion of the intermediate nitride layer 45' left exposed by the recess 45RC. This is followed by a step of photolithographic definition of this polysilicon or silicon oxide layer so as to obtain at least a first and a second spacer, 46A and 46B, in correspondence of the first walls W1 of the first and second portions, 45A and 45B, of the insulating layer 45, as well as at least a third and a fourth spacer, 47A and 47B, in correspondence of the second walls W2 of the first and second portions, 45A and 45B, of the insulating layer 45, as shown in FIG. 4C. The first and second spacers 46A, 46B lie on the intermediate nitride layer 45' and the third and fourth spacers lie on the insulating layer 45.

It should be remarked that the portion of the intermediate nitride layer 45', left exposed by the first and second spacers 46A and 46B defines a contact region of the gate metal structure of the HEMT transistor 40 so obtained, such contact region having a reduced size with respect to a region obtained by an optical lithography according to the prior art, thereby reducing the gate charge.

A further etching step defines a deeply recessed portion 47RC in correspondence of the portion of the intermediate nitride layer 45' left exposed between the first and second spacers, 46A and 46B, as shown in FIG. 4C. In particular, the deeply recessed portion 47RC extends through the intermediate nitride layer 45', the barrier epitaxial layer 43 and at least a thickness fraction of the epitaxial layer 42 and is realized by a dry etching step.

According to an aspect of this fourth embodiment of the disclosure, the method comprises a step of deposition of a dielectric layer 48, in particular realized by an Atomic Layer Deposition or ALD, as shown in FIG. 4D. The thickness of the dielectric layer 48 ranges between 5 and 100 nm. The dielectric layer 48 covers the insulating layer 45 in correspondence of its first and second portions 45A and 45B, the first and second spacers 46A and 46B, the third and fourth spacers 47A and 47B, as well as the walls and bottom of the deeply recessed portion 47RC.

Moreover, the method comprises a step of defining a gate metal structure 44G on the dielectric layer 48 in correspondence of the deeply recessed portion 47RC. In particular, the gate metal structure 44G is realized so as to at least partially fill the deeply recessed portion 47RC.

Figure 4E:
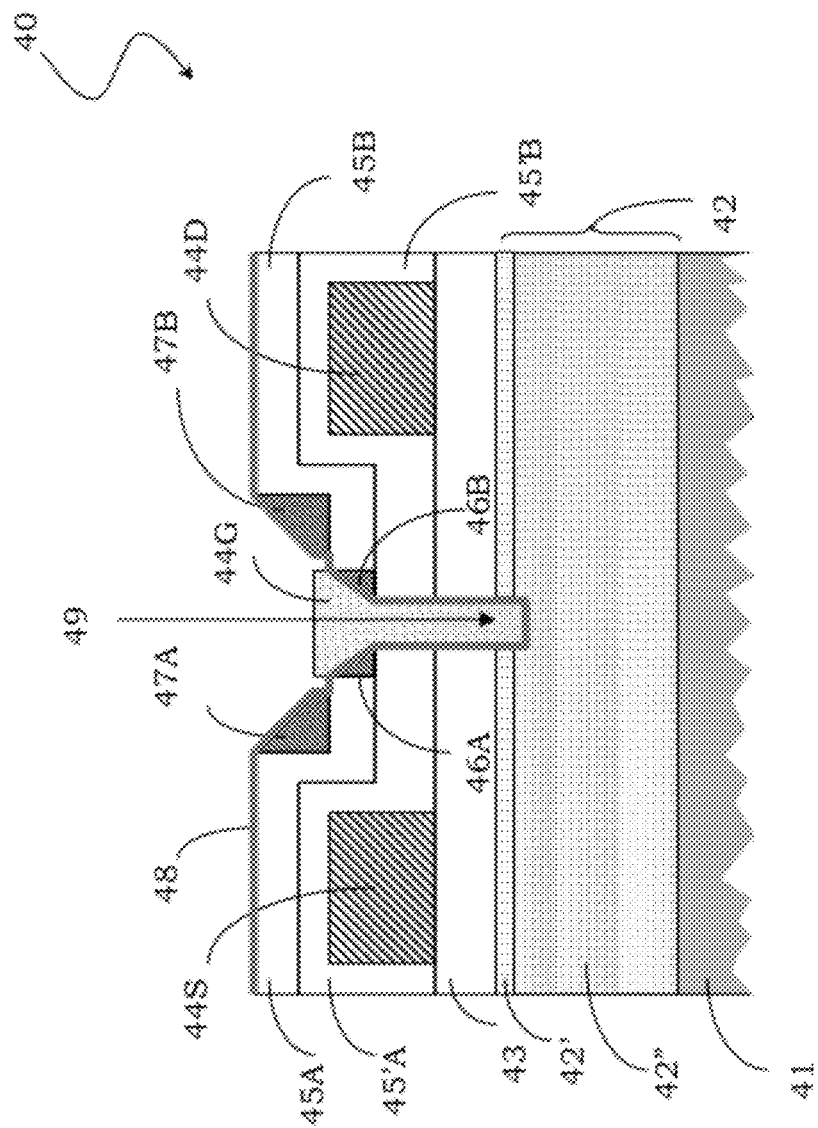

In particular, the step of defining the gate metal structure 44G comprises a deposition and definition step of a photoresist layer (not shown), a deposition by evaporation step of a gate metal layer in the deeply recessed portion 47RC, and a lift-off definition step of the photoresist layer and the gate metal layer so as to obtain the gate metal structure 44G in correspondence with a contact gate recessed portion 49, the gate metal structure 44G at least partially filling the contact gate recessed portion 49 as shown in FIG. 4E. A sputtering, a lithographic definition and an etching of the gate metal layer can be also used to realize the gate metal structure 44G.

The gate metal structure 44G on the dielectric layer 48 suppresses unwanted gate current and simultaneously enhances the parasitic influence on the frequency performance of the HEMT transistor as a whole. In particular, the gate metal structure 44G on the dielectric layer 48 has a shaped profile and acts as a field plate of the HEMT transistor.

In this way a HEMT transistor 40 is obtained. According to an aspect of the disclosure, the HEMT transistor 40 hence comprises:
- a heterojunction comprising an epitaxial layer 42 and a barrier epitaxial layer 43;
- a source structure 44S and a drain structure 44D lying on the barrier epitaxial layer 43 and being covered by respective portions, 45A and 45B of a nitride layer 45 and respective portions, 45'A and 45'B, of an intermediate layer 45';
- a dielectric layer 38 lying on the portions 45A and 45B of the insulating layer 45 and on a contact gate recessed portion 49 extending in the epitaxial layer 42 and at least partially in the barrier epitaxial layer 43 in correspondence of an area between the portions, 45'A and 45'B, of the additional nitride layer 45', as well as
- a gate metal structure 44G on the dielectric layer 48 in correspondence of the contact gate recessed portion 49.

In particular, the gate metal structure 44G at least partially fills the contact gate recessed portion 49.

Moreover, the epitaxial layer 42 may comprise an n-type epitaxial layer 42' and a p-type epitaxial layer 42", the former being in contact with the barrier epitaxial layer 43.

More in particular, each of the portions, 45A and 45B, of the nitride layer 45 in correspondence of the source and drain structures, 44S and 44D, has a stepped configuration with an L shaped terminal portion having a first wall W1 on the insulating layer 45 and a second wall W2 in correspondence of a corner of this L-shaped terminal portion.

According to an aspect of the disclosure, the HEMT transistor 40 also comprises at least first and second spacers, 46A and 46B, in correspondence of the first walls W1 of the first and second portions, 45A and 45B, of the insulating layer 45, these first and second spacers lying on the intermediate nitride layer 45' facing the contact gate recessed portion 49, as well as at least a third and a fourth spacer, 47A and 47B, in correspondence of the second walls W2 of the first and second portions, 45A and 45B, of the insulating layer 45, these third and fourth spacers lying on the insulating layer 45. Moreover, the first, second, third and fourth spacers are covered by the dielectric layer 48.

In this way, the gate metal structure 44G has a shaped profile and acts as a field plate of the HEMT transistor 40.

According to a manufacturing method of one embodiment of the disclosure, a HEMT transistor is obtained, which comprises at least a pair of spacers able to reduce the size of the contact gate with respect to an optical lithography technique, thereby reducing the gate charge.

In one embodiment, the spacers are removed before completing the HEMT transistor. In another embodiment, the spacers are not be removed but covered by a dielectric layer. In this way, the dielectric spacers allow to reduce the gate-source capacitance Cgs and the gate-drain capacitance Cgd.

Finally, the spacers creates a shaped profile for the gate metal structure allowing to realize a gradual field plate with a spreading of the electric field that improves the breakdown voltage of the HEMT transistor so obtained.

Obviously, a technician of the field, aiming at meeting incidental and specific needs, will bring several modifications to the above described method and transistor structure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A HEMT transistor, comprising:
   a heterojunction including a first epitaxial layer and a barrier epitaxial layer;
   a source structure and a drain structure lying on said barrier epitaxial layer;
   first and second insulating portions respectively covering the source and drain structures;
   first and second spacers on said barrier epitaxial layer and between the first and second insulating portions;
   a dielectric layer at least partially on said first and second insulating portions and said first and second spacers; and
   a gate metal structure positioned in a contact gate portion between said first and second spacers and at least partially on said first and second insulating portions, said first and second spacers, and the dielectric layer, the dielectric layer being positioned between the spacers and the gate metal structure, said gate metal structure having a shaped profile, and being configured to act as a field plate of said HEMT transistor, wherein said first epitaxial layer comprises an n-type epitaxial layer and a p-type epitaxial layer, said n-type epitaxial layer being in contact with said barrier epitaxial layer.

2. The HEMT transistor according to claim 1, further comprising, under said dielectric layer, a deeply recessed portion extending in said first epitaxial layer and at least partially in said barrier epitaxial layer in correspondence of said contact gate area between said first and second spacers.

3. The HEMT transistor according to claim 2, wherein said dielectric layer is on walls and a bottom of said deeply recessed portion.

4. The HEMT transistor according to claim 3, wherein said gate metal structure contacts said dielectric layer within said deeply recessed portion.

5. The HEMT transistor according to claim 4, wherein said gate metal structure fills said deeply recessed portion and at least partially overlies said dielectric layer on said first and second insulating portions.

6. The HEMT transistor according to claim 4, further comprising:
   a first intermediate layer portion interposed between said first insulating portion and said source structure; and
   a second intermediate layer portion interposed between said second insulating portion and said drain structure.

7. The HEMT transistor according to claim 6, wherein said first and second insulating portions each have an L-shaped terminal portion having a first wall and a second wall in contact with each other at a corner of said L-shaped terminal portion.

8. The HEMT transistor according to claim 7, further comprising third and fourth spacers, said first and second spacers respectively lying on said first walls of said first and second insulating portions and said third and fourth spacers respectively lying on said second walls of said first and second insulating portions.

9. A HEMT transistor, comprising:
   a heterojunction including a semiconductor barrier layer;
   a source structure and a drain structure on said barrier layer;
   first and second insulating portions respectively covering the source and drain structures, wherein said first and second insulating portions each have an L-shaped terminal portion having a first wall and a second wall in contact with each other at a corner of said L-shaped terminal portion;
   first and second spacers on said barrier layer and between the first and second insulating portions;
   a dielectric layer at least partially on said first and second insulating portions and between said first and second spacers;
   a gate electrode positioned in a contact gate portion between said first and second spacers and at least partially on said first and second insulating portions, said first and second spacers, and the dielectric layer, said gate electrode being configured to act as a field plate of said HEMT transistor;
   a first intermediate layer portion interposed between said first insulating portion and said source structure;
   a second intermediate layer portion interposed between said second insulating portion and said drain structure; and
   third and fourth spacers, said first and second spacers respectively lying on said first walls of said first and second insulating portions and said third and fourth spacers respectively lying on said second walls of said first and second insulating portions.

10. The HEMT transistor according to claim 9, further comprising, under said dielectric layer, a deeply recessed portion extending in said barrier layer in correspondence of said contact gate area between said first and second spacers.

11. The HEMT transistor according to claim 10, wherein said dielectric layer is on walls and a bottom of said deeply recessed portion.

12. The HEMT transistor according to claim 11, wherein said gate electrode contacts said dielectric layer within said deeply recessed portion.

13. The HEMT transistor according to claim 12, wherein said gate electrode fills said deeply recessed portion and at least partially overlies said dielectric layer on said first and second insulating portions.

14. The HEMT transistor according to claim 9, wherein said barrier layer is a barrier epitaxial layer and the heterojunction includes an n-type epitaxial layer and a p-type epitaxial layer, said n-type epitaxial layer being in contact with said barrier epitaxial layer.

15. A method of manufacturing a HEMT transistor, comprising:
   forming a heterojunction including a first epitaxial layer and a barrier epitaxial layer;
   forming a source structure and a drain structure lying on said barrier epitaxial layer;
   forming first and second insulating portions respectively covering the source and drain structures;
   forming first and second spacers on said barrier epitaxial layer and between the first and second insulating portions;
   forming a dielectric layer at least partially on said first and second insulating portions and said first and second spacers; and
   forming a gate metal structure positioned in a contact gate portion between said first and second spacers and at least partially on said first and second insulating portions, said first and second spacers, and the dielectric layer, the dielectric layer being positioned between the spacers and the gate metal structure, said gate metal structure having a shaped profile, and being configured to act as a field plate of said HEMT transistor, wherein said first epitaxial layer comprises an n-type epitaxial layer and a p-type epitaxial layer, said n-type epitaxial layer being in contact with said barrier epitaxial layer.

16. The method according to claim 15, further comprising, before forming the dielectric layer, defining by etching a deeply recessed portion extending in said first epitaxial layer and at least partially in said barrier epitaxial layer in correspondence of said contact gate area between said first and second insulating portions.

17. The method according to claim 16, wherein forming said dielectric layer includes covering walls and a bottom of said deeply recessed portion with said dielectric layer.

18. The method according to claim 17, wherein forming said gate metal structure includes forming said gate metal structure in said deeply recessed portion.

19. The method according to claim 16, further comprising, after forming the first and second spacers, defining a recessed portion of said barrier epitaxial layer by etching a portion of the barrier epitaxial layer left exposed between said first and second spacers.

20. The method according to claim 19, wherein:
   forming said dielectric layer includes covering walls of said recessed portion with said dielectric layer; and
   forming said gate metal structure includes forming said gate metal structure in said recessed portion, the gate metal structure being laterally surrounded by the dielectric layer.

* * * * *